US008135354B2

(12) United States Patent
Duron et al.

(10) Patent No.: US 8,135,354 B2
(45) Date of Patent: Mar. 13, 2012

(54) METHOD AND SYSTEM FOR CHOPPED ANTENNA IMPEDANCE MEASUREMENTS WITH AN RFID RADIO

(75) Inventors: Mark Duron, East Patchogue, NY (US); Sean Connolly, Stony Brook, NY (US); Martin Strzelczyk, New Market, MD (US)

(73) Assignee: Symbol Technologies, Inc., Holtsville, NY (US)

( * ) Notice: Subject to any disclaimer, the term of this patent is extended or adjusted under 35 U.S.C. 154(b) by 402 days.

(21) Appl. No.: 12/476,320

(22) Filed: Jun. 2, 2009

(65) Prior Publication Data

US 2010/0304684 A1    Dec. 2, 2010

(51) Int. Cl.
*H04B 17/00* (2006.01)
*H04B 1/06* (2006.01)
*H04Q 5/22* (2006.01)

(52) U.S. Cl. .................. 455/67.11; 455/226.1; 455/230; 455/254; 455/41.1; 455/44; 340/10.1; 340/10.3

(58) Field of Classification Search ............... 455/67.11, 455/226.1, 227, 228, 230, 254, 289, 41.1, 455/41.2, 44; 340/10.1, 10.3, 505
See application file for complete search history.

(56) References Cited

U.S. PATENT DOCUMENTS

| | | | | |
|---|---|---|---|---|
| 6,161,762 A * | 12/2000 | Bashan et al. | ................ | 235/492 |
| 6,889,086 B2 * | 5/2005 | Mass et al. | ...................... | 607/60 |
| 7,148,804 B2 * | 12/2006 | Salesky et al. | ............. | 340/572.4 |
| 7,215,976 B2 * | 5/2007 | Brideglall | .................. | 455/552.1 |
| 7,422,157 B2 * | 9/2008 | Smets et al. | .................. | 235/486 |
| 7,439,860 B2 * | 10/2008 | Andresky | .................... | 340/572.1 |
| 7,683,780 B2 * | 3/2010 | Reynolds | ................... | 340/572.1 |
| 7,907,056 B2 * | 3/2011 | Shimizu | ..................... | 340/572.5 |
| 2006/0045219 A1 * | 3/2006 | Wang et al. | .................... | 375/346 |
| 2010/0052869 A1 * | 3/2010 | Stewart | ...................... | 340/10.52 |
| 2011/0043328 A1 * | 2/2011 | Bassali | ........................ | 340/5.71 |

OTHER PUBLICATIONS

Corresponding International Application No. PCT/US2001/035244—International Search Report with Written Opinion mailed Dec. 7, 2010—10 pages.
Safarian A et al—"RF Identification (RFID) Reader Front Ends With Activ e Blocker Rejection"—IEEE Transactions on Microwave Theory and Techniques, IEEE Service Center—vol. 57, No. 5, May 2009—pp. 1320-1329.
Udaya Shankar Natarajan et al—"Rapid UHF RFID silicon debut and production testing", International Test Conference 2007—Oct. 2007—Paper 12.1—pp. 1-10.

* cited by examiner

*Primary Examiner* — Duc M Nguyen

(57) ABSTRACT

Described herein are methods, devices and systems for characterizing an attached antenna to an electronic device, such as a radio frequency identification ("RFID") reader. One exemplary embodiment is related to a method comprising outputting a low amplitude modulation ("AM") index radio frequency ("RF") waveform, the waveform simulating tag data timing and bandwidth, removing a direct current ("DC") component from the waveform to create a chopped portion of the waveform, applying at least one vector analyzer technique on the chopped portion of the waveform, characterizing at least one antenna impedance vector of the waveform.

24 Claims, 3 Drawing Sheets

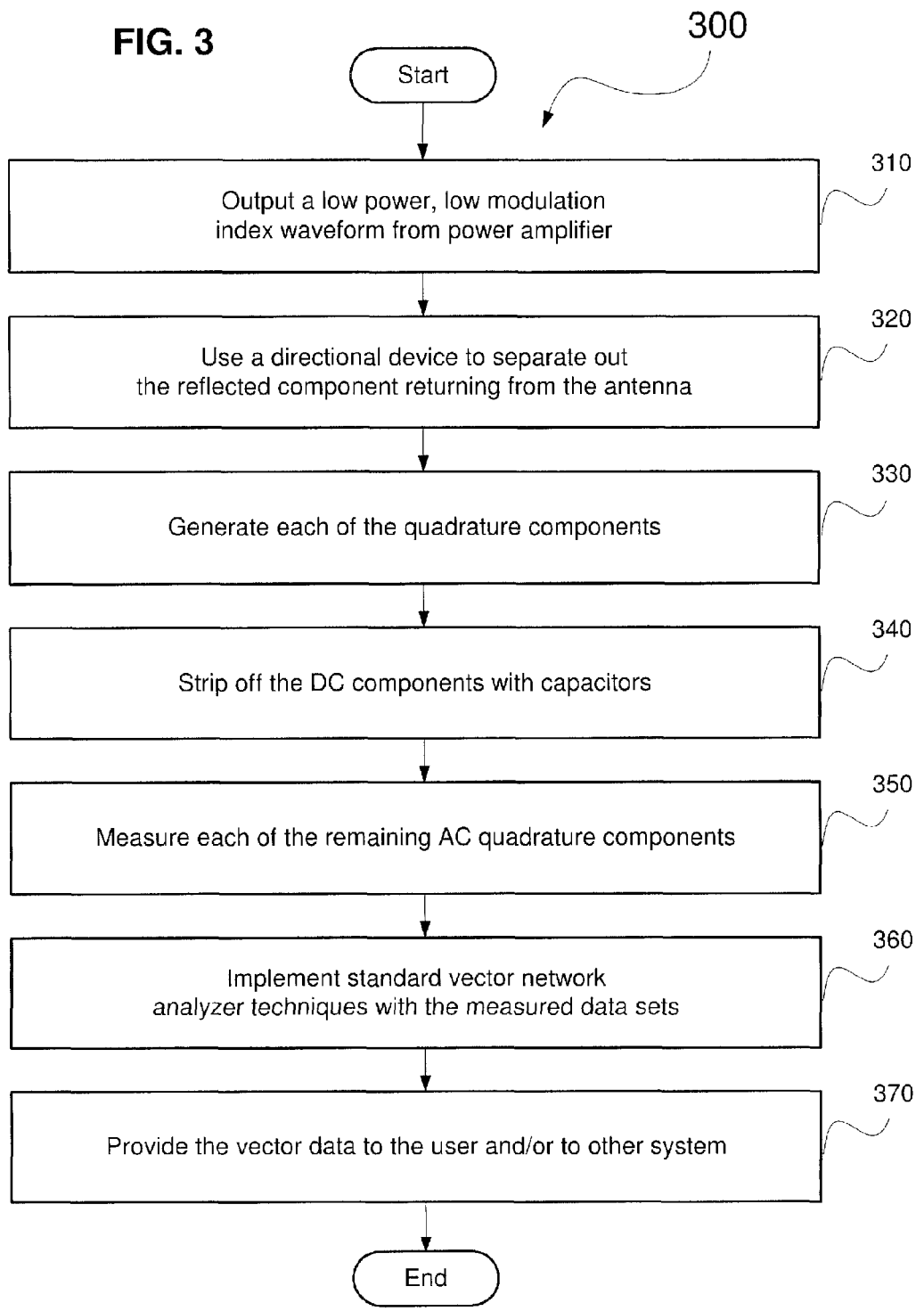

METHOD AND SYSTEM FOR CHOPPED ANTENNA IMPEDANCE MEASUREMENTS WITH AN RFID RADIO

FIELD OF THE INVENTION

The present application generally relates to systems and methods for characterizing an attached antenna to an electronic device, such as a radio frequency identification ("RFID") reader. Specifically, the exemplary system and methods may measure antenna impedance match vectors in order to allow the antenna to be characterized while embedded within the electronic device.

BACKGROUND

RFID technology includes systems and methods for non-contact reading of targets (e.g., products, people, vehicles, livestock, etc.) in order to facilitate effective management of these targets within a business enterprise. Specifically, RFID technology allows for the automatic identification of targets, storing target location data, and remotely retrieving target data through the use of RFID tags, or transponders. The RFID tags are an improvement over standard bar codes since the tags may have read and write capabilities. Accordingly, the target data stored on RFID tags can be changed, updated and/or locked. Due to the ability to track moving objects, RFID technology has established itself in a wide range of markets including retail inventory tracking, manufacturing production chain, and automated vehicle identification systems. For example, through the use of RFID tags, a retail store can see how quickly the products leave the shelves, and gather information on the customer buying the product.

Within an RFID system, the RFID tag may be a device that is either applied directly to, or incorporated into, one or more targets for the purpose of identification via radio signals. A typical RFID tag may contain at least two parts. A first part is an integrated circuit for storing and processing information, as well as for modulating and demodulating a radio signal. A second part is an antenna for receiving and transmitting radio signals including target data. A typical RFID reader may contain a radio transceiver and may be capable of receiving and processing these radio signals from several meters away and beyond the line of sight of the tag.

SUMMARY OF THE INVENTION

The present invention is generally related to methods and systems for characterizing an attached antenna to an electronic device, such as a radio frequency identification ("RFID") reader. One exemplary embodiment is related to a method comprising outputting a low amplitude modulation ("AM") index radio frequency ("RF") waveform, the waveform simulating tag data timing and bandwidth, removing a direct current ("DC") component from the waveform to create a chopped portion of the waveform, applying at least one vector analyzer technique on the chopped portion of the waveform, characterizing at least one antenna impedance vector of the waveform.

A further exemplary embodiment is related to a communication device comprising an RF source outputting a low AM modulation index RF waveform, the waveform simulating tag data timing and bandwidth, a plurality of DC blocks removing a DC component from the waveform to create a chopped portion of the waveform, a processor applying at least one vector analyzer technique on the chopped portion of the waveform and characterizing at least one antenna impedance vector of the waveform.

A further exemplary embodiment is related to a system, comprising a transmitting means for transmitting a low AM modulation index RF waveform, the waveform simulating tag data, a means for removing a DC component from the waveform to create a chopped portion of the waveform, an analyzing means for applying at least one vector analyzer technique on the chopped portion of the waveform, and a characterizing means for characterizing antenna at least one impedance vector of the waveform.

BRIEF DESCRIPTION OF THE DRAWINGS

FIG. 3 shows an exemplary method for measuring chopped antenna impedance with an RFID radio according to the present invention.

DETAILED DESCRIPTION

Figure 1:
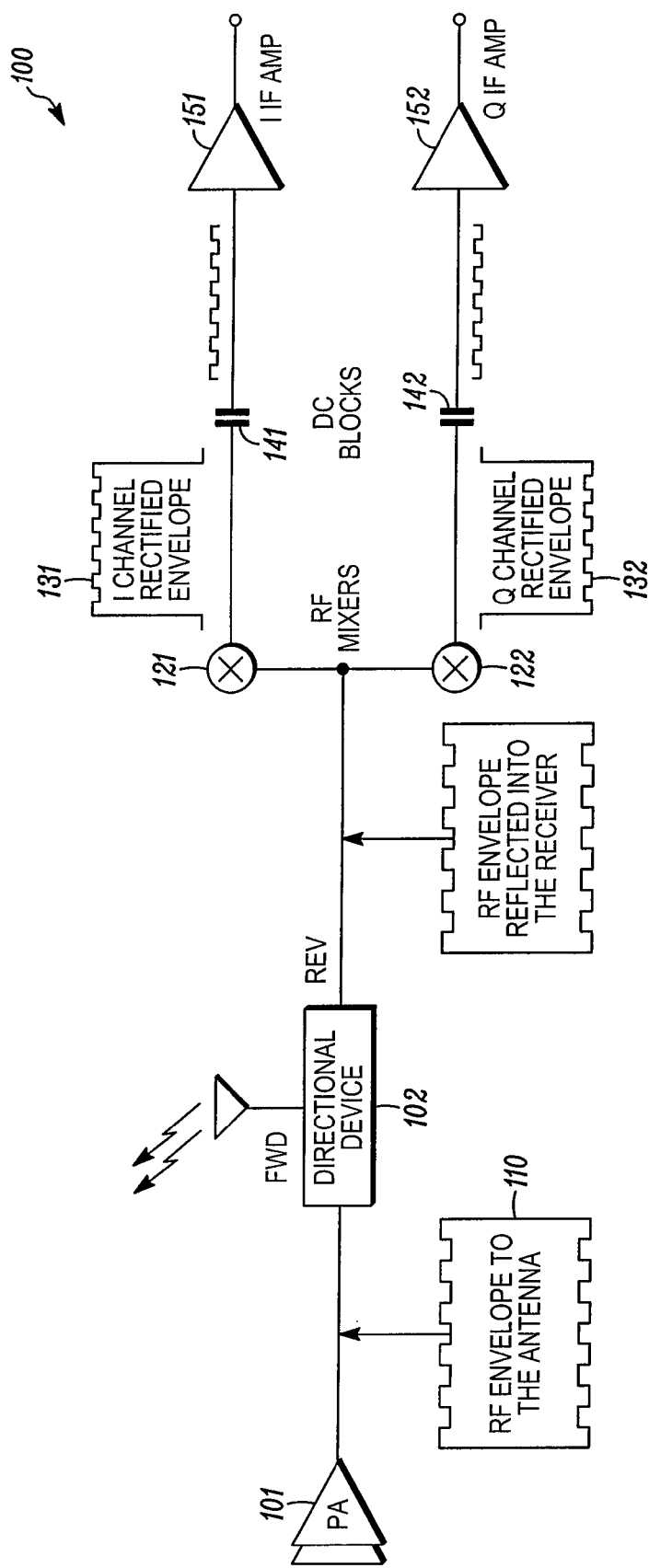
FIG. 1 shows an exemplary portion of the topology of an RFID system that typically exists within an RFID reader. A partially-chopped (e.g., a low level of AM modulation index) RF signal from the transmitter has been applied to it for the purpose of measuring the antenna impedance vector according to the present invention.

The exemplary embodiments of the present invention may be further understood with reference to the following description of exemplary embodiments and the related appended drawings, wherein like elements are provided with the same reference numerals. The present application generally relates to systems and methods for characterizing an attached antenna to an electronic device, such as a radio frequency identification ("RFID") reader. Specifically, the exemplary system and methods may measure antenna impedance vectors in order to allow the antenna to be characterized while embedded to the electronic device.

A Brief Description of a Passive RFID Tag Operation, and the Justification for a Chopped Antenna Impedance Measurement System The information that is contained within an RFID passive tag is read out by the use of an RFID reader. The reader functions by first transmitting an RF signal that is intercepted by the antenna on the RFID tag. The intercepted RF signal is rectified by the tag circuitry for the purpose of charging a temporary energy storage device, which is usually a capacitor. The charged capacitor supplies the energy that is used to run the tag integrated circuit (IC) state machine. The first function of the IC is to interpret the reader RF signal modulation that represents the addressing information. If the addressing code corresponds to the tag identification, the tag responds by modulation of the impedance that is connected to the tag antenna. The impedance modulation changes the tag antenna RF reflectivity. The tag performs the impedance modulation with a digital code that represents the tag information, such as its identification number. The modulated tag antenna reflectivity is the method by which the tag sends a signal back to the reader receiver.

The advantage of the passive RFID tag system is that the tag has a significant simplicity compared to the usual communication systems since it does not require a separate transmitter. The disadvantage is that the reader transmission frequency and the reader reception frequency are essentially identical. The reader cannot separate the two signals by the use of RF frequency selective filtering, a technique that is used within more typical communication systems.

Most fixed position readers create the needed isolation by using separate transmitting and receiving antennas that are specifically designed to display approximately 20 to 30 dB of isolation. Without that degree of isolation the receiver will be overloaded by the presence of the co-located transmitter signal. The presence of overloading would create receiver desensitization and intermodulation distortion.

The problem of the isolation requirement becomes more severe within portable RFID reader systems. A portable reader is so volume-limited that only one antenna can be contained within the usual package. The single antenna must simultaneously share the readers transmitting and receiving functions. The 20 to 30 dB of isolation between these functions is usually accomplished by way of the high directivity of a carefully tuned directional coupler, or a circulator, that is connected to the antenna. However, the directivity can only be maintained if the antenna impedance (S11) displays a reflection coefficient that is approximately −20 to −30 dB (when referenced to the impedance the directional coupler or circulator embedded within the RFID interrogator.

A carefully designed reader antenna can achieve the required S11 performance over the required frequency range. However, a portable RFID reader must operate within a dynamic environment that subjects the reader to these perturbations: (1) operator hand motion; (2) the relative motion of RF-reflective objects that are within the operating field of the antenna; and (3) minor changes within the volume of the antenna near field, due to changes within the package of the portable reader due to aging and being dropped, for instance.

An often-used solution is to deploy an echo canceller circuit. The echo canceller usually operates by creating an equal amplitude out-of-phase signal to nullify the specific S11 vector signal that the antenna is presenting at each particular instant of operation. Proper operation of the echo canceller requires accurate data of the S11 vector that the antenna is presenting. Usually the level of echo cancellation that is achieved is not much better than the accuracy of the antenna S11 measurement. An alternate solution may use the S11 vector information to control a tunable antenna in order to minimize the reflection from the antenna.

It should be noted that S11 measurements may be accomplished in conjunction with an echo canceller or a tunable antenna circuit within a feed-back servo mechanism. However, a large amount of inaccuracy of the S11 measurement function within the servo mechanism can cause an instability, and it could greatly increase the time required for the nullifying to take place because the servo will have to hunt for the correct solution throughout many cycles of the servo function time constant.

The chopped antenna impedance measurement system according to the exemplary embodiments of the present invention may be capable of achieving high accuracy of the S11 measurement because it has the ability to dynamically adjust the level of the transmitter small index of amplitude modulation in order to achieve the desired signal to noise ratio (SNR) of the in-phase and quadrature ("I/Q") demodulated signals of the S11 measurement without exceeding the receiver system dynamic range. The process with be described in greater details below.

It should be noted that the chopped carrier technique according to the present invention may be non-standard for RFID systems. In many cases the present invention may be implemented by using additional hardware and software components, as well as added computing capabilities. For example, an RFID reader system may contain a transmitter with an amplitude modulation capability that enables the function of RFID tag addressing. RFID tag addressing may indicate which tag(s), or which class of tags, should respond at this time. The low level modulation according to an exemplary embodiment of the present invention may be a modification of a high level of modulation that is used during tag addressing. Accordingly, it is possible to combine the operation of tag reading (e.g., particular application and timing of that modulation), and antenna S11 measurement during certain steps of the tag addressing. Therefore, the exemplary embodiments allow for RFID chip sets to be able to measure the return loss through the DC blocking caps that the chips require. The higher frequency modulation may pass through the DC blocking caps and also be proportional to the antenna reflection vector.

Normally the radio is adjusted for a nominal output impedance of 50 Ohms. The antenna is also adjusted to a nominal 50 Ohm input impedance. When the two subassemblies are married together, a match is established between the two subsystems. The quality of the match between the two sub systems is primarily a function of the impedance of each subsystem relative to the other. In many cases, if each subsystem was adjusted to the same nominal value, the married match will be of reasonable quality. However, the true measure of the match between the two subsystems can be stated as (S22−S11)/(S22+S11)=Gamma. Where S22 is the vector output impedance of the radio, and S11 is the vector input impedance of the antenna, and gamma is the vector reflection coefficient of the match. A perfect match will result in gamma equal to zero. Therefore the match may be most accurately measured by the radio.

Accordingly, the exemplary embodiments of the systems and methods described herein may be implemented during various processes, such as acceptance testing, providing feedback to echo canceling circuitry, tunable antennas, etc. Furthermore, the exemplary systems and methods may allow a standard chipset within the electronic device to perform these measurements without making any changes to an RFID application-specific integrated circuit ("ASIC"). According to exemplary embodiments of the present invention, one of the features includes the internal production of channelized vector data. In other words, the exemplary embodiments may eliminate the need for an RFID ASIC having cancellation capabilities, such as vector measurement circuitry. Therefore, this may allow for a direct connection between an external echo canceller or tunable antenna input and the vector data output of the ASIC using the described inventive techniques. Furthermore, it also may allow for antenna matching measurement at any time, even without echo cancellation. Thus, measurements may be made at anytime that the data needs to be used.

One skilled in the art of RFID technology understands that in a typical RFID system, external detectors may be used to measure the quality of the antenna reflective impedance vectors, although external detectors are subject to measurement loading errors that the radio itself is not subject to. Whatever impedances the radio detectors present to the system are the true impedances that the system will see under actual operation. The antenna reflective impedance vector (S11) may be described as a voltage vector that represents the relative phase and amplitude of the antenna impedance mismatch that depends upon the length of the transmission line, the characteristics of the RFID antenna, and the reflectivity of the objects located within the field of the antenna.

A typical receiver topology in a homodyne RFID implementation will use blocking capacitors to isolate the baseband amplifiers from the DC component produced within the I and Q down converters (also called vector demodulators) due to the composite of the transmitter carrier leakage within the receiver circuitry, and the total antenna reflection S11. This carrier energy at the RF input of the down converters has a major phase coherent component caused by the reflection of the transmitter energy from the antenna and from the reflective objects that may be between the antenna and the demodulator. Accordingly, the coherent energy beats against the local oscillator ("LO") of the vector demodulator mixers (I and Q) to produce the so-called zero intermediate frequency ("IF") DC components. The DC components of the baseband energy are often high enough to cause the baseband amplifier chain to go into compression if it is not blocked by the capacitors.

According to the exemplary embodiments of the present invention, a low modulation index RF waveform may be a new signal emitted from the RF transmitter. Specifically, the RFID transmitter may generate this new, low AM modulation index, signal. Many RFID transmitter modulator circuits are capable of doing this, they simply have not been asked to do so. It is being done only for the purpose of measuring the S11 reflective characteristics of the reader antenna, and its associated circuitry. The reflective signal is a strong signal at the receiver I and Q demodulators. Therefore, a low AM modulation index source signal may be adequate for deriving a sufficient signal-to-noise ratio (SNR) at the receiver. Usually, only a high AM modulation index transmitter signal (i.e., 100%) is used for addressing the tags since the SNR that is sensed at the tag(s) must be maximized in order to realize a good signal to noise ratio at full tag-reading range. The low AM modulation index waveform may be impressed upon a continuous wave ("CW") carrier that precedes each RFID tag interrogation round. This may be the time when the tags are charging their power supplies from the RF field generated by the CW carrier. Accordingly, using an AM modulation index of only a few percent as described herein, the RFID tags would still operate as if there was no modulation present.

An existing receiver circuitry may be used to gather the raw data of the antenna reflection vector at each frequency. Then, new software will process the raw data, and the resulting coefficient can be used to protect the transmitter from extreme antenna conditions or the information can be applied to either an added echo canceller circuit, tunable antenna, or to an added video canceller circuit. Previous echo canceller, and tunable antenna networks also required separate, and usually added, RF reflection sensing components to measure the raw antenna reflection information. These components measure the large DC voltage component of the demodulated echo. However, the exemplary embodiments of the present invention make use of the existing receiver vector demodulator to measure a small AC-coupled signal component to perform that function.

Within a typical RFID system that contains an echo canceller or a tunable antenna network, external detectors connected to reverse-sensing ports of directional couplers are often used to quantify the scalar magnitude of the reflection that the antenna presents to a radio frequency transmitter within the RFID system. While this method will measure the magnitude of the reflection, it usually does not measure the phase of the reflection. It should be noted that the phase of reflection may be an important parameter for complete echo cancellation. Alternatively, a redundant set of more expensive in-phase and quadrature ("I/Q") components demodulators can be used, externally to the ASIC, to give a vector solution. In contrast to this typical RFID system, as will be described in greater detail below, the exemplary embodiments of the present invention allow for measurement of the quality of antenna vectors without the use of external detector circuits, and without performing an ASIC change.

According to the exemplary embodiment of the present invention, the systems and methods described herein offer the ability to characterize and measure the antenna vectors on a mobile computing unit, such as an RFID reading device. More specifically, the carrier power from the RFID signal may be low level amplitude modulated, or "chopped", in order to make antenna impedance measurements. The term "chopped" described herein may be defined as synonymous to "modulated." In other words a chopped signal may be a type of modulation on a signal.

The exemplary embodiments of the present invention allow for improved utility of RFID readers within a mobile device. Those skilled in the art will understand that the RFID readers according to the present invention may also be used to describe RFID readers within any type of electronic device in accordance with the principles and functionality described herein. For example, the exemplary embodiments may also be implemented in a stationary fixed mount device. Thus, the use of a mobile RFID reader is only exemplary.

FIG. 1 shows an exemplary topology of an RFID system 100, such as within an RFID reader, for measuring the vector of antenna impedance by way of a chopped modulation (e.g., a low level of AM modulation index) with an otherwise unmodified RFID radio according to the present invention. For example, the RFID system 100 may include a low level modulated RF envelope 110, a plurality of RF vector demodulators 121 and 122, an I-channel ("in-phase") demodulated envelope 131, a Q-channel ("quadrature") demodulated envelope 132, a plurality of DC blocks 141 and 142, an I intermediate frequency ("IF") or "video" amplifier 151, and a Q IF amplifier or "video" amplifier 152. The RFID system 100 may further include a power amplifier ("PA") 101 and a directional device 102.

It should be noted that the low level of transmitter amplitude modulation provides the "test signal" for antenna S11 determination. The software analysis of the raw data (e.g., of that "test signal") that may be measured at the I and Q demodulators allows the antenna S11 vector to be derived. Accordingly, this may be done during what would be the CW charge time of the tag interrogation cycle. Thus, it may be transparent to the tag reading process.

According to the exemplary embodiments of the RFID system 100, an RF transmitter (e.g., an RF source) that creates the RF envelope 110 may be commanded to output a low AM modulation index square wave RF waveform that will be similar in period and timing to the tag data from an RFID tag. This will allow the demodulated data to pass through the receiver data filters unaffected. Specifically, the in-phase ("I") component of the data signal may be transmitted from the first RF demodulator 121 to the I-channel DC block 141. Furthermore, the quadrature component of the data signal may be transmitted from the second RF demodulator 122 to the Q-channel DC block 142.

At this time the DC blocks 141 and 142 may remove the large DC component caused by the unmodulated portion of the waveform for both the I-channel and Q-channel components, as provided by the respective demodulated envelopes 131 and 132. The remaining chopped portion will then be proportional to an antenna reflection coefficient. It should be noted that the antenna reflection coefficient may be described as the demodulated polarity and the amplitude, or the intensity, of a reflected wave relative to an incident wave. A positive (+) polarity detected waveform will contain an in-phase square wave of modulation. A negative (−) polarity will contain an opposite phase of square wave of modulation. The "in-phase" and "out-of-phase" of square wave of demodulation is being measured with respect to the reference phase of the original modulation waveform 110 that existed at the transmitter. In other words, the reflection coefficient S11 that is present at the directional coupler output may be the ratio of the vector amplitude, or electric field strength, of the reflected wave, which was caused by an impedance mismatch that is present on the transmission line, to the amplitude of the incident wave on a transmission line. Accordingly, the reflection coefficient may be observable when the wave propagation of an RF signal traverses through a transmission line medium containing discontinuities. Accordingly, the antenna transmission coefficient may be derived from the reflection coefficient by recognizing the principle of "conservation of energy".

Once the transmitter signal is chopped (e.g., low level modulated), the corresponding I-Q raw data signals from the antenna reflection coefficient (S11) may become available. Specifically, the chopped signals may become available to the IF chain thereby simulating RFID tag data. For instance, the chopped signal I-channel signal may be received by the I IF amplifier 151 and the chopped signal Q-channel of the signal may be received by the Q IF amplifier 152. The transmitted chopped signal modulation rate will usually be selected to be identical to the tag signal information data rate. By way of this selection the band pass filtering characteristic of the IF amplifier will derive the best signal-to-noise ratio (SNR), and demodulation signal accuracy. Standard vector network analyzer analysis techniques of the measured I and Q data may then be implemented in order to quantify the antenna S11 performance over the RF frequency range.

According to the exemplary embodiments of the system 100, a composite receiver may consider the reflected transmitted modulation to be a response from the RFID tag. Therefore, the system 100 may be allowed to gather characterization data from the antenna signal. It should be noted that a processor within the RFID system may be utilized to characterize the antenna S11 signal. Specifically, the user may measure a received signal strength indication ("RSSI") from both the I-channel and the Q-channel. This measurement may be performed at each channel in order to build a scattering parameter ("S-parameter") Smith chart.

It should be noted that the low level amplitude modulated square wave "chopped" signal depicted in FIG. 1 may be used to demonstrate the principle of operation. Other modulation waveforms, such a sine wave, for example, may also be used. By using a square wave for the displayed example it is easier to view the reference phase of the RF modulation envelope 110 versus an in-phase and (+) DC demodulated "I" signal condition 131, or a corresponding out-of-phase condition and (−) DC demodulated signal (e.g., RF modulation envelope 110 versus Q-channel demodulated envelope 132) of the demodulated "Q" waveform.

Note that the complete demodulated "I" waveform 131 shown in the example of FIG. 1 has a positive (+) DC offset, and the waveform retains the same square wave polarity after the DC decoupling of capacitor 141, indicating that an in-phase and (+) condition is present. The peak-to-peak magnitude of the DC decoupled square wave is indicating the magnitude of the DC offset, and the removal of the DC component is creating a waveform that is much less likely to saturate the IF amplifier.

Correspondingly, the negative (−) DC offset of the "Q" waveform 132 of the example shown in FIG. 1 is producing an out-of-phase square waveform, and the smaller peak-to-peak magnitude of the DC decoupled waveform of capacitor 142 is indicating the smaller magnitude of the (−) DC offset 132.

It should be noted that should one of the DC isolated "I" or "Q" demodulated waveforms display a peak-to-peak magnitude that exceeds the dynamic range of an IF amplifier, the operating algorithm may order a decrease in the AM modulation index or the transmitter waveform to subsequently lower the measured peak-to-peak magnitude. In addition, it may also reduce the overall level, thereby proportionately lowering the entire waveform. The algorithm may then mathematically normalize the new peak-to-peak magnitude measurement in order to properly evaluate the DC level that is indicating the S11 magnitude. By this process the procedure of the exemplary embodiments may be able to properly measure the magnitude of a worse case antenna S11 condition of a nearly total reflection, such as might happen if the operator placed the RFID reader antenna in contact with a metallic object.

A properly chosen low level square wave amplitude modulation may produce a demodulated and capacitive coupled (e.g., DC isolated) waveform at the IF amplifier that is very similar to the low level RF waveform that an RFID tag will produce under a normal range condition. It should be noted that the low level amplitude modulated "chopped" waveform may also be a sine wave, a "cosine-on-a-pedestal", and/or other types of modulation waveforms.

It should also be noted that the low level amplitude modulated "chopped" waveform is being transmitted at essentially any transmitter power. This will allow the antenna S11 measurement to take place at the same time that the RFID tag is being "energy charged", which is a necessary step that takes place at the beginning of the tag addressing sequence. By operating in this manner it becomes possible to perform an antenna S11 measurement during the first step in the reading of each tag. In many scenarios the reading of individual tags can be separated by a few milliseconds. This will allow the RFID reader operating system to sense, in real time, the dynamic changes in the antenna S11 that might take place as an operator moves a hand in front of the antenna, or when he changes the orientation of the antenna, which might change the observed reflectivity of the external objects that are within the field of view of the antenna. The presence of the dynamic S11 data will allow an echo canceller or a tunable antenna system to continuously maintain the total signal that is sensed at the receiver to a level that is below the level of receiver non-linearity or saturation. In this way the receiver will maintain the maximum tag signal sensitivity, and experience the minimum level of intermodulation distortion that otherwise would be present in a "rich reader" environment.

Figure 2:
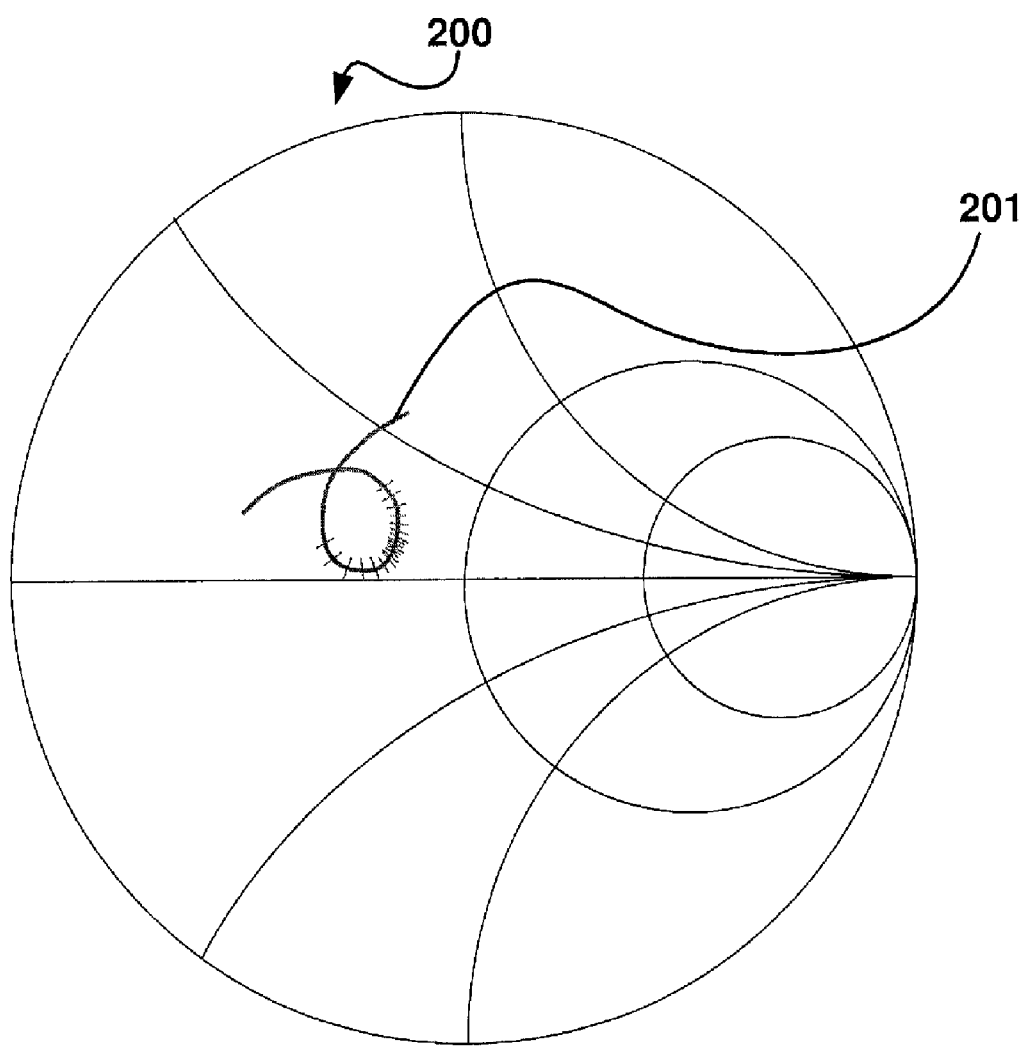
FIG. 2 shows an exemplary frequency swept S-parameter Smith chart that can be derived according to the exemplary embodiments of the present invention.

FIG. 2 shows an exemplary swept frequency S-parameter Smith chart 200 according to the exemplary embodiments of the present invention. One skilled in the art would understand that the Smith chart 200 may be described as a graphical aid designed within the field of RF-engineering to assist in solving problems with transmission lines, matching circuits, etc. According to the exemplary embodiments of the present invention, the frequency-ordered channelized vector data may represent the results from the polarity sensitive RSSI measurements. Specifically, the measured I-channel and Q-channel RSSI frequency-associated data points may form an S11 plot 201 within the Smith chart 200. It should be noted that the channelized vector data may be the output (i.e., the results of the vector analysis) of the standard vector network analyzer techniques. Accordingly, the algorithm used to process the I and Q raw data into the antenna S11 frequency swept measurements is similar to that used by a conventional Vector Network Analyzer ("VNA").

According to one embodiment of the present invention, for instance, the data provided by the Smith chart 200 may be utilized by an echo canceller. Accordingly, this embodiment will allow for the use of a simpler external canceller on an RFID ASIC that has no inherent cancellation capabilities. This embodiment would not require the RFID ASIC to contain any of the external RF vector measurement circuitry. Therefore, a exemplary standard RFID, for instance, chipset may measure antenna impedance vectors without making any changes to the ASIC. Furthermore, the exemplary system 100 may be capable of characterizing an RFID antenna while embedded within a mobile unit, and using that information to tune that antenna in a servo manner.

FIG. 3 shows an exemplary method 300 for measuring chopped signal antenna impedance with an RFID radio according to the present invention. The exemplary method 300 will be described with reference to the exemplary system 100 of FIG. 1. As described above, the exemplary method 300 may measure antenna impedance vectors in order to allow for an RFID antenna to be characterized while embedded to the electronic device, such as the RFID reader 100.

In step 310, the method 300 may output a low power, low modulation index waveform from the power amplifier 101. Specifically, the method 300 may command an RF transmitter to output a slightly unusual low AM modulation index "chopped" RF waveform that could be a square wave, Sine wave, etc. As described above, this RF waveform may provide antenna reflection data to the receiver circuitry that is similar in frequency and bandwidth to that which is normally provided by an RFID tag. In addition, the modulated portion of the receiver waveform may have low signal level difference, or maximum (peak) to minimum (valley) excursions that does not saturate the IF amplifier circuitry.

In step 320, the method 300 may use a direction device, such as the directional device 102 of FIG. 1, to separate out the reflected component returning from the antenna.

In step 330, the method 300 may generate each of the quadrature components.

In step 340, the method 300 may use capacitors to strip off the DC component caused by the unmodulated portion of the received waveform. Specifically, the DC blocks 141 and 142 may block the frequently large DC voltage component from the RF waveform, thus minimizing the possible saturation of the IF amplifiers. Accordingly, the remaining modulated portions may be proportional to the antenna reflection coefficient in the chopped waveform polarities, and magnitudes, of the I and Q components. This modulated, or chopped, portion of the S11 signal reflected from the antenna may be similar to the data that is usually received from an RFID tag.

In step 350, the method 300 may measure and characterize the antenna data, such as the I-channel polarity-sensitive received signal strength indication ("RSSI") and the Q-channel polarity-sensitive RSSI, for each of the remaining AC quadrature components. As noted above, a processor within the RFID system may be utilized to characterize the antenna-reflected signal. Specifically, the data collected for each channel may be used to build an S-Parameter Smith chart, such as the Smith chart 200. Accordingly, from the measurement provided in this step, the data within the Smith chart 200 may be used to characterize the antenna impedance vectors (e.g., the S11).

In step 360, the method 300 may implement standard vector network analyzer techniques with the measured data sets. Specifically, the method 300 may implement swept frequency S11 derivation techniques on the chopped I-Q data of the antenna. As described above, these techniques may allow the performance of the antenna to be quantified over the frequency. According to the exemplary embodiments of the present invention, the majority of the composite receiver circuitry may presume that this antenna-reflected transmitter modulation RF signal is an actual response from the RFID tag.

In step 370, the method 300 may provide the resulting antenna-reflection data (the S11) to the user and/or to other systems and components (e.g., an echo canceller or tunable antenna). In other words, this corresponding vector information may be used to feedback to echo canceling or antenna tuning circuitry. Thus, the exemplary method 300 allows for the use of an external echo canceller or tunable antenna on an RFID ASIC without any external vector measurement circuitry, wherein the ASIC may have no inherent tuning or cancellation capabilities. According to the exemplary embodiments of the present invention, the antenna S11 data may be the output of the algorithm that processes the I and Q raw data.

It should also be noted that according to additional or alternative embodiments of the present invention, the exemplary method 200 may be further implemented during acceptance testing of the RFID system 100.

According to additional and/or alternative embodiments of the method 300, the method 300 may further comprise using a low level AM modulation index signal source where the modulation rate is similar to the data rate of an RFID tag, so as to maximize an S11 measurement demodulated signal to noise ratio ("SNR") by taking advantage of the frequency selectivity characteristic of the receiver IF amplifier. Accordingly, the SNR maximization may allow a lower AM modulation index to be used, thus the transmitter will be operating at a higher average power output during the S11 measurement, thus maximizing the tag energy charging function that can simultaneously be taking place.

According to additional and/or alternative embodiments of the method 300, the method 300 may further comprise using a low level AM modulation index signal source, where the AM modulation index can be dynamically adjusted, to decrease the saturation characteristic of the I and Q receiver function demodulation circuitry, so as to minimize the demodulator non-linearity and third order intermodulation distortion, so as to find the best compromise between S11 "measurement linearity accuracy" and measurement signal to noise ratio (SNR).

According to additional and/or alternative embodiments of the method 300, the method 300 may further comprise using a low level AM modulation index signal source, derived from the RFID transmitter in such a way that the transmitter is running at any power output during the S11 measurement, so that the measurement can take place simultaneously with the tag charging interval that is part of the tag addressing sequence.

According to additional and/or alternative embodiments of the method 300, the method 300 may further comprise using a low level AM modulation index signal source, derived from an RFID transmitter in such a way that the transmitter is running at any power output during the S11 measurement at the normal I and Q receiver demodulators, so that an S11 measurement can be made during the energy charging period at the beginning of the addressing sequence of reading each tag, so that a dynamic real time set of S11 measurements can continuously take place as the environment of a portable RFID reader is being changed.

It will be apparent to those skilled in the art that various modifications may be made in the present invention, without departing from the spirit or the scope of the invention. Thus, it is intended that the present invention cover modifications and variations of this invention provided they come within the scope of the appended claimed and their equivalents.

What is claimed is:

1. A method, comprising:
   outputting a low amplitude modulation ("AM") index radio frequency ("RF") waveform, the waveform simulating tag data timing and bandwidth;
   removing a direct current ("DC") component from the waveform to create a chopped portion of the waveform;
   applying at least one vector analyzer technique on the chopped portion of the waveform;
   characterizing at least one antenna impedance vector of the waveform.

2. The method according to claim 1, wherein the chopped portion is substantially proportional to an antenna reflection coefficient present at an in-phase and quadrature ("I/Q") demodulator input.

3. The method according to claim 1, further comprising:
   providing the chopped portion of the waveform to a composite receiver.

4. The method according to claim 1, further comprising:
   determining a polarity sensitive I-channel received signal strength indication ("RSSI") and a polarity sensitive Q-channel RSSI of the waveform.

5. The method according to claim 4, further comprising:
   providing the I-channel and the Q-channel RSSIs to one of an echo canceller and a tunable antenna.

6. The method according to claim 1, wherein the outputting step is performed by an RF transmitter.

7. The method according to claim 6, wherein the RF transmitter is a radio frequency identification reader, and the tag-like data is provided from at least one radio frequency identification tag reader.

8. The method according to claim 1, further comprising:
   maximizing an S11 measurement demodulated signal to noise ratio ("SNR") using a low level AM modulation index signal source having a modulation rate substantially similar to a data rate of an RFID tag.

9. The method according to claim 1, further comprising:
   decreasing a saturation characteristic of an I and Q receiver function demodulation circuitry using a low level AM modulation index signal source to minimize the demodulator non-linearity and third order intermodulation distortion.

10. The method according to claim 1, further comprising:
    using a low level AM modulation index signal source derived from a transmitter running at a power output during an S11 measurement, wherein the S11 measurement is taken simultaneously with a tag charging interval of a tag addressing sequence.

11. The method according to claim 1, further comprising:
    using a low level AM modulation index signal source derived from a transmitter running at a power output during an S11 measurement at a normal I and Q receiver demodulators, wherein the S11 measurement is continuously taken during an energy charging period of a tag addressing sequence.

12. A communication device, comprising:
    a radio frequency ("RF") source outputting a low amplitude modulation ("AM") modulation index radio frequency ("RF") waveform, the waveform simulating tag data timing and bandwidth;
    a plurality of direct current ("DC") blocks removing a DC component from the waveform to create a chopped portion of the waveform;
    a processor applying at least one vector analyzer technique on the chopped portion of the waveform and characterizing at least one antenna impedance vector of the waveform.

13. The communication device according to claim 12, wherein the chopped portion is substantially proportional to an antenna reflection coefficient.

14. The communication device according to claim 12, wherein the chopped portion of the waveform is provided to a composite receiver.

15. The communication device according to claim 12, wherein the processor further determines a polarity sensitive I-channel received signal strength indication ("RSSI") and a polarity sensitive Q-channel RSSI of the waveform.

16. The communication device according to claim 15, wherein the I-channel and the Q-channel RSSIs are provided to one of an echo canceller and a tunable antenna.

17. The communication device according to claim 12, wherein the RF transmitter is a radio frequency identification reader, and the tag data is provided from at least one radio frequency identification tag.

18. A system, comprising:
    a transmitting means for transmitting a low amplitude modulation ("AM") modulation index radio frequency ("RF") waveform, the waveform simulating tag data;
    a means for removing a direct current ("DC") component from the waveform to create a chopped portion of the waveform;
    an analyzing means for applying at least one vector analyzer technique on the chopped portion of the waveform; and
    a characterizing means for characterizing antenna at least one impedance vector of the waveform.

19. The system according to claim 18, wherein the chopped portion is substantially proportional to an antenna reflection coefficient.

20. The system according to claim 18, further comprising:
    a providing means for providing the chopped portion of the waveform to a composite receiver.

21. The system according to claim 18, further comprising:
    a determining means for determining a polarity sensitive I-channel received signal strength indication ("RSSI") and a polarity sensitive Q-channel RSSI of the waveform.

22. The system according to claim 21, further comprising:
    a means for providing the I-channel and the Q-channel RSSIs to one of an echo canceller and a tunable antenna.

23. The system according to claim 18, wherein the transmitting means is an RF transmitter.

24. The system according to claim 23, wherein the RF transmitter is a radio frequency identification reader, and the tag data is provided from at least one radio frequency identification tag.

* * * * *

UNITED STATES PATENT AND TRADEMARK OFFICE
CERTIFICATE OF CORRECTION

| | | |
|---|---|---|
| PATENT NO. | : 8,135,354 B2 | Page 1 of 1 |
| APPLICATION NO. | : 12/476320 | |
| DATED | : March 13, 2012 | |
| INVENTOR(S) | : Duron et al. | |

It is certified that error appears in the above-identified patent and that said Letters Patent is hereby corrected as shown below:

On the title page, item (56), under "OTHER PUBLICATIONS", in Column 2, Line 5, delete "Activ e" and insert -- Active --, therefor.

Signed and Sealed this
Eighteenth Day of December, 2012

David J. Kappos
*Director of the United States Patent and Trademark Office*